United States Patent
Akashi

Patent Number: 5,917,759
Date of Patent: Jun. 29, 1999

[54] INPUT INTERFACE LEVEL DETERMINER FOR USE IN A MEMORY DEVICE

[75] Inventor: Shunichi Akashi, Tokyo, Japan

[73] Assignee: Nec Corporation, Tokyo, Japan

[21] Appl. No.: 09/134,158

[22] Filed: Aug. 14, 1998

[30]  Foreign Application Priority Data

Aug. 14, 1997 [JP] Japan ................................ 9-219466

[51] Int. Cl.⁶ .................................................. G11C 16/04
[52] U.S. Cl. ................................ 365/189.07; 365/189.09
[58] Field of Search ........................ 365/189.07, 189.09, 365/226; 326/62

[56] References Cited

U.S. PATENT DOCUMENTS 5,331,219  7/1994  Nakamura ......................... 365/189.11

OTHER PUBLICATIONS

Standard of Electronic Industries Association of Japan; Stub Series Terminated Logic For 3.3 Volts (SSTL_3); Mar. 1996.

*Primary Examiner*—David Nelms
*Assistant Examiner*—Trong Phan
*Attorney, Agent, or Firm*—Foley & Lardner

[57]  ABSTRACT

In order to determine input interface levels of a memory device at the time when operating the device, a constant voltage generator is provided to generate a constant voltage. A comparator, coupled to receive the constant voltage, compares the constant voltage with either first or second reference voltage. The first and second reference voltages are selectively applied to said comparator via an external pin of the memory device. A connection controller is coupled to receive a comparison result which has been generated from the comparator. The connection controller, in response to the comparison result related to the first reference voltage, establishes electrical connection between the external pin and an input buffer provided in the memory device. For example, the first reference voltage is used to operate the memory device at Stub Series Terminated Logic (SSTL) levels. On the other hand, the connection controller, in response to the comparison result related to the second reference voltage, prevents electrical connection between the external pin and the input buffer. Therefore, the connection controller allows the memory device to operate at Low Voltage Transistor-Transistor Logic (LVTTL) levels by way of example.

7 Claims, 4 Drawing Sheets

INPUT INTERFACE LEVEL DETERMINER FOR USE IN A MEMORY DEVICE

BACKGROUND OF THE INVENTION

1. Field of the Invention

The present invention relates generally to improved techniques for fabricating IC (integrated circuit) memory devices, and more specifically to an input interface level determiner which is provided in a memory device and eliminates the need for permanently determining memory's input interface levels during IC fabricating steps.

2. Description of the Related Art

It is known in the art that LVTTL (low voltage transistor-transistor logic) is commonly used to define voltage levels recognizable by memory devices. DRAMs (dynamic random access memories accept and provide data at LVTTL levels. Input buffers or receivers, which are provided in DRAMS and supplied with these levels, should recognize whether a voltage is intended to be a high or a low voltage. According to the LVTTL specifications, all voltages higher than 2.0 volts (viz., Voltage Input High min (VIH min)) are determined as a high voltage, and all voltages lower than 0.8 volts (Voltage Input Low Max (VIL max)) are recognized as a low voltage.

Recently, an SSTL (stub series terminated logic) specification or standard has been developed particularly with the objective of providing a relatively simple upgrade path from LVTTL designs. The SSTL specification is particularly intended to improve operations in situations where busses must be isolated from relatively large stubs. In order to operate a memory cell at SSTL levels, it is necessary for a user to determine a reference level VREF (usually around 1.5 volts). Generally speaking, the SSTL specification dictates that all voltages higher than (VREF+0.4) volts are determined as a high voltage, and all voltages lower than (VREF−0.4) volts are recognized as a low voltage. It should be noted that the above-mentioned values of ±0.4 volts may slightly change depending on circuit designs (for example). The SSTL standard has been provided in detail in a paper entitled "Stub Series Terminated Logic for 3.3 Volts (SSTL_3)" published by Standard of Electronic Industries Association of Japan, March 1996.

By way of example, the LVTTL may be used for memory devices operating up to about 100 MHz, while the SSTL is used for memory devices whose operating frequencies range above 100 MHz. This may be resulted from the fact that the voltage swing of SSTL (about 0.8 volts) is much narrower than that of LVTTL ( about 2.0 volts). It is understood that the performance characteristics of the memory devices operating at SSTL levels are stricter than those of the devices operating at LVTTL levels.

Before turning to the present invention it is deemed advantageous to briefly describe, with reference to FIG. 1, a conventional technique which may be relevant to the present invention.

As shown in FIG. 1, an interface level determiner 10 is comprised of a fuse 12 and a connection controller 14. The fuse 12 is provided between a power source line Vcc and the input terminal of the controller 14. It is assumed that when a memory chip, equipped with the interface level determiner 10, is intended to be used at SSTL levels, the fuse 12 is not broken in order to apply the power source voltage (Vcc) to the controller 14. That is to say, a high logic level (viz., Vcc) applied to the connection controller 14 indicates that the memory chip in question is to operate at LVTTL levels, the fuse 12 is destroyed, at a suitable IC fabricating step, so as to open the input terminal of the controller 14. The memory device users are informed, from the chip manufacturers, as to whether the memory device should be used at SSTL levels or LVTTL levels. In the above, it is understood that the fuse 12 can be replaced by a wire which is omitted in the case of LVTTL mode.

When the memory chip dedicated to SSTL levels is used, a reference voltage VREF is applied to an external terminal 16. The connection controller 14, which typically takes the form of a transfer gate, is responsive to the high logic level (viz., Vcc) through the fuse 12 and relays or transfer the reference voltage VREF to an input buffer 18 which typically takes the form of a differential transistor pair. Thus, the voltages applied to the buffer 18 via a data input pin 20 are recognized as a high or a low logic level using the reference voltage VREF (viz., at SSTL levels) as mentioned above.

On the other hand, in the case where the memory chip operating at LVTTL levels is used, the connection controller 14 is supplied with no input through the fuse 12 and thus does not work as a transfer gate. In this case, to be safe, no voltage is applied to the pin 16. Since the input buffer (viz., differential transistor pair) 16 recognizes the voltages applied to the data pin 20 at LVTTL levels.

As mentioned above, the memory devices operating at SSTL or LVTTL levels are permanently or uniquely determined during the IC fabricating steps, after which the performance characteristics of the devices are implemented. Let us consider the case where a given device dedicated to SSTL mode is found unsuitable for SSTL mode but usable at LVTTL levels. In this instance, it is practically impossible to change the interface mode of the device with the result of lowering the yield of the good devices.

SUMMARY OF THE INVENTION

It is therefore an object of the present to provide improved techniques which eliminate the need for permanently determining memory's input interface levels during IC fabricating steps.

In brief, these objects are achieved by the techniques wherein in order to determine input interface levels of a memory device at the time when operating the device, a constant voltage generator is provided to generate a constant voltage. A comparator, coupled to receive the constant voltage, compares the constant voltage with either first or second reference voltage. The first and second reference voltages are selectively applied to the comparator via an external pin of the memory device. A connection controller is coupled to receive a comparison result which has been generated from the comparator. The connection controller, in response to the comparison result related to the first reference voltage, establishes electrical connection between the external pin and an input buffer provided in the memory device. For example, the first reference voltage is used to operate the memory device at Stub Series Terminated Logic (SSTL) levels. On the other hand, the connection controller, in response to the comparison result related to the second reference voltage, prevents electrical connection between the external pin and the input buffer. Therefore, the connection controller allows the memory device to operate at Low Voltage Transistor-Transistor Logic (LVTTL) levels by way of example.

One aspect of the present invention resides in an interface level determiner provided in a memory device, comprising: a constant voltage generator for generating a constant voltage; a comparator coupled to receive the constant voltage, the first and second reference voltages being selectively applies to the comparator via an external pin of the memory device; and a connection controller coupled to receive a comparison result generated from the comparator, the connection controller, in response to the comparison result related to the first reference voltage, establishing electrical connection between the external pin and an input buffer provided in the memory device.

Another aspect of the present invention resides in an interface level determiner provided in a memory device, comprising; a constant voltage generator for generating a constant voltage; a comparator coupled to receive the constant voltage, the comparator comparing the constant voltage with either first or second reference voltage, the first and second reference voltages being selectively applied to the comparator via an external pin of the memory device; a connection controller coupled to receive a comparison result generated from the comparator, the connection controller, in response to the comparison result related to the first reference voltage, allowing the first reference voltage to pass therethrough; and a latch coupled to latch the first reference voltage from the connection controller, the first reference voltage latched being applied to an input buffer provided in the memory device.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be described with reference to FIGS. 2 and 3.

Figure 1:
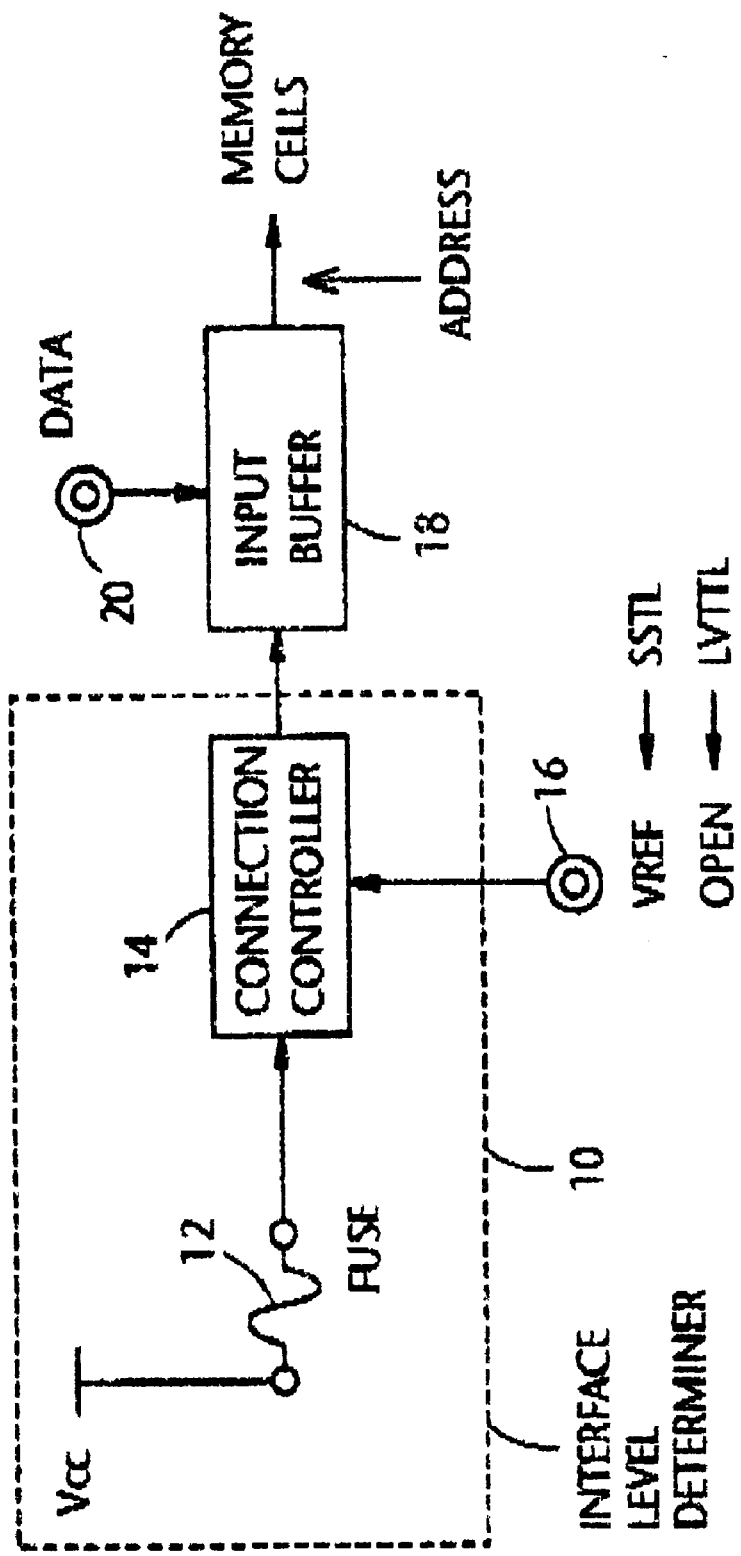
FIG. 1 is a diagram schematically showing a conventional interface level controller, having referred to in the opening paragraphs.
Figure 2:
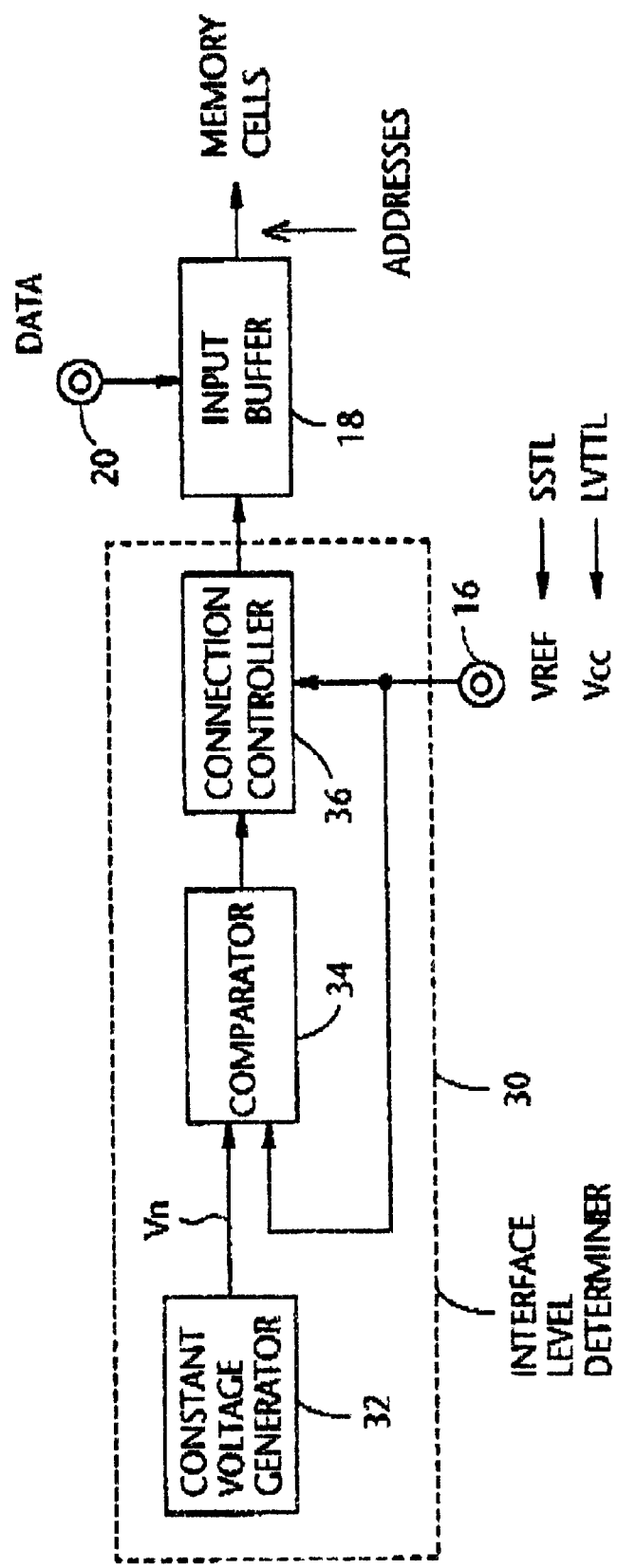
FIG. 2 is a block diagram showing a first embodiment of the present invention.

As shown in FIG. 2, an interface level determiner 30 comprises a constant voltage generator 32, a comparator 34, and a connection controller 36. Other than this, the first embodiment is substantially identical to the conventional arrangement shown in FIG. 1. The connection controller 36 is similar to the counterpart 14 of FIG. 4 and takes the form of a transfer gate. The descriptions of the blocks or portions already referred to in connection with FIG. 1 will be omitted for the sake of simplifying the instant disclosure except for becoming necessary in context.

A goal of the present invention is to eliminate the irrecoverable nature of determination of input interface mode during IC fabrication steps.

Figure 3:
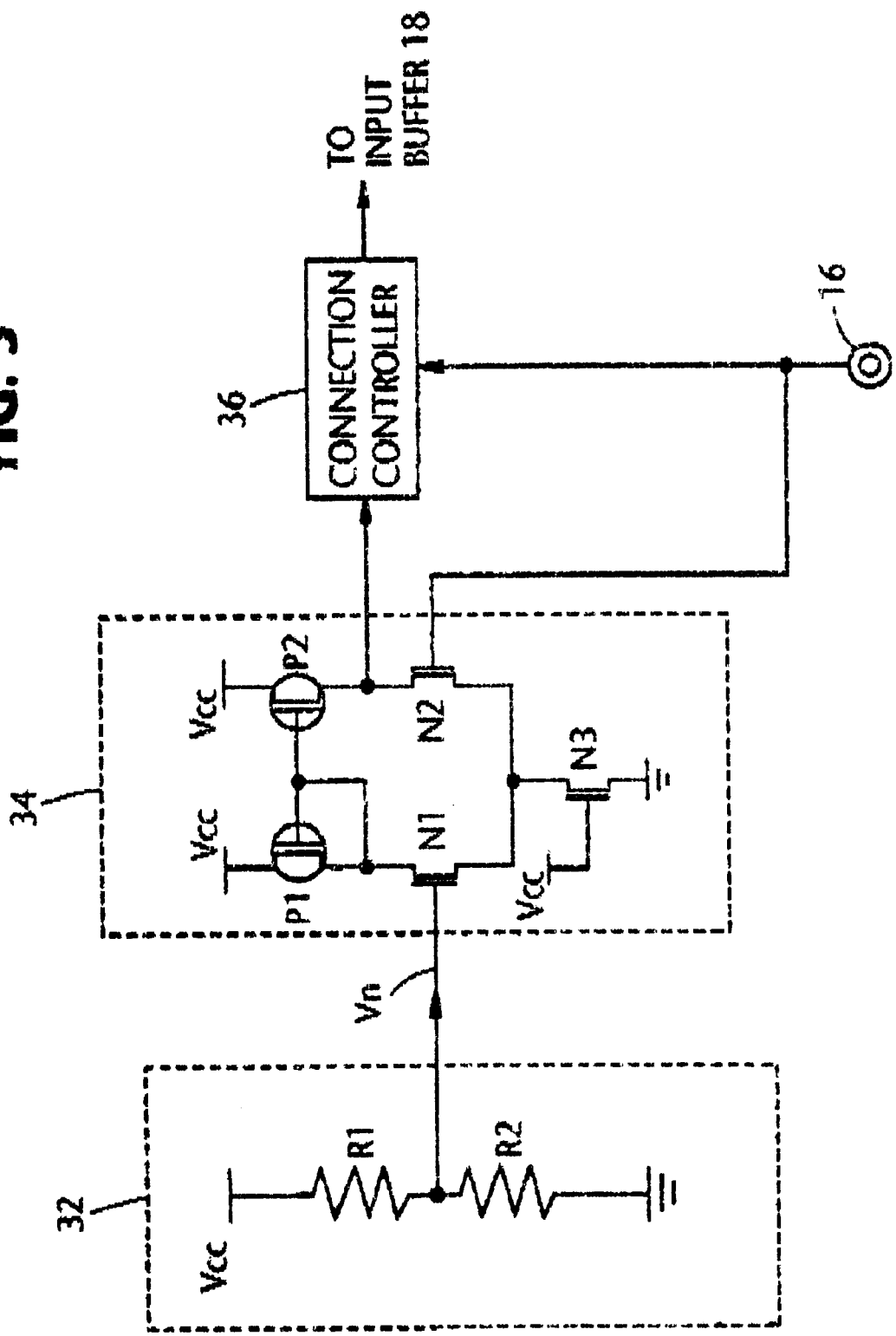
FIG. 3 is a block diagram showing in detail some blocks shown in FIG. 2.

FIG. 3 shows circuit arrangements of the blocks 32 and 34 of FIG. 2, both of which are well known in the art. The constant voltage generator 32 shown in FIG. 3 is a voltage divider consisting of two resistors R1 and R2. On the other hand, the comparator includes two p-channel transistors P1 and P2 which form a current mirror circuit, and further includes three n-channel transistors N1–N3 which constitute a differential amplifier.

For the sake of convenience of descriptions, it is assumed that a reference voltage VREF utilized for SSTL mode is about 1.5 volts and that the power source Vcc is about 3.3 volts. Further, assuming that the constant voltage generator 32 issues a voltage Vn which is about 2.4 volts. When the user intends a memory device at SSTL mode in accordance with the manufacture's instructions, he or she applies VREF to the pin 16. Therefore, the comparator 34 generates a high logic level in this case, which is applied to the connection controller 36. Thus, VREF applied to the pin 16 is routed to the input buffer 18 via the connection controller 36.

On the other hand, when the user intends a memory device at LVTTL mode in accordance with the manufacture's instructions, he or she applies Vcc to the pin 16. Therefore, the comparator 34 generates a low logic level that is applied to the connection controller 36. In this case, the controller 36 does not function and thus no voltage is transferred to the input buffer 18. Thus, the input buffer 18 operates at LVTTL mode.

Figure 4:
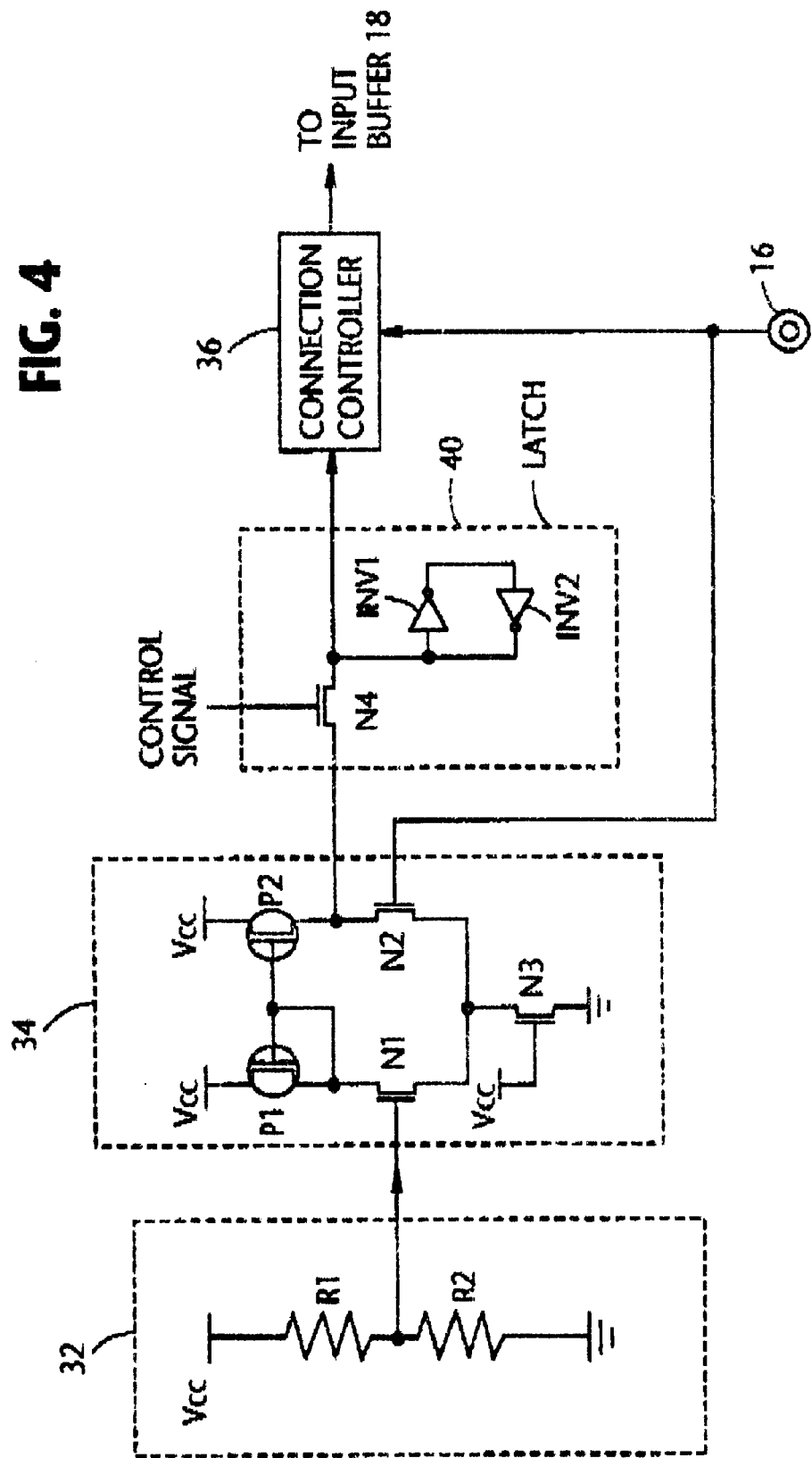
FIG. 4 is a block diagram showing a second embodiment wherein the blocks already illustrated in FIG. 2 have been omitted.

A second embodiment of the present invention will be described with reference to FIG. 4. The second embodiment includes a latch 40 in addition to the blocks of the first embodiment. As shown in FIG. 4, the latch 40 is of a conventional type and includes an n-channel transistor N4 and two inverters INV1 and INV2. The transistor N4 is rendered conductive when a control signal exhibiting a high logic level is applied to the gate thereof. The latch 40 maintains the initial output condition thereof and accordingly, the input voltage recognizing operations at the buffer 18 is not adversely affected by undesirable voltage change of VREF while the memory operates at SSTL mode.

It will be understood that the above disclosure is representative of only two possible embodiments of the present invention and that the concept on which the invention is based is not specifically limited thereto.

What is claimed is:

1. An interface level determiner provided in a memory device, comprising:

a constant voltage generator for generating a constant voltage;

a comparator coupled to receive said constant voltage, said comparator comparing said constant voltage with either first or second reference voltage, said first and second reference voltages being selectively applied to said comparator via an external pin of said memory device; and a connection controller coupled to receive a comparison result generated from said comparator, said connection controller, in response to the comparison result related to said first reference voltage, establishing electrical connection between said external pin and an input buffer provided in said memory device.

2. An interface level determiner as claimed in claim 1, wherein said first reference voltage is used to operate said memory device at Stub Series Terminated Logic (SSTL) levels.

3. An interface level determiner as claimed in claim 1, wherein said connection controller, in response to the comparison result related to said second reference voltage, prevents electrical connection between said external pin and said input buffer thereby allowing said memory device to operate at Low Voltage Transistor-Transistor Logic (LVTTL) levels.

4. An interface level determiner as claimed in claim 1, further comprising a latch interconnected between said connection controller and said input buffer.

5. An interface level determiner provided in a memory device, comprising:

- a constant voltage generator for generating a constant voltage;
- a comparator coupled to receive said constant voltage, said comparator comparing said constant voltage with either first or second reference voltage, said first and second reference voltages being selectively applied to said comparator via an external pin of said memory device;
- a connection controller coupled to receive a comparison result generated from said comparator, said connection controller, in response to the comparison result related to said first reference voltage, allowing said first reference voltage to pass therethrough; and
- a latch coupled to latch said first reference voltage from said connection controller, said first reference voltage latched being applied to an input buffer provided in said memory device.

6. An interface level determiner as claimed in claim 5, wherein said first reference voltage is used to operate said memory device at Stub Series Terminated Logic (SSTL) levels.

7. An interface level determiner as claimed in claim 5, wherein said connection controller, in response to the comparison result related to said second reference voltage, prevents electrical connection between said external pin and said input buffer thereby allowing said memory device to operate at Low Voltage Transistor-Transistor Logic (LVTTL) levels.

* * * * *

UNITED STATES PATENT AND TRADEMARK OFFICE
CERTIFICATE OF CORRECTION

PATENT NO. : 5,917,759
DATED : June 29, 1999
INVENTOR(S) : Shunichi AKASHI

It is certified that error appears in the above-identified patent and that said Letters Patent is hereby corrected as shown below:

Title page, item, [73] Assignee, delete "Nec" and replace with --NEC--.

Signed and Sealed this

Thirteenth Day of June, 2000

Attest:

Q. TODD DICKINSON

*Attesting Officer*      *Director of Patents and Trademarks*